US012701949B2

(12) United States Patent
Lee et al.

(10) Patent No.: US 12,701,949 B2
(45) Date of Patent: Aug. 4, 2026

(54) CONTACT APPARATUS FOR ARRANGING SEMICONDUCTOR DEVICES

(71) Applicant: TEXAS INSTRUMENTS INCORPORATED, Dallas, TX (US)

(72) Inventors: Zi Chow Lee, Petaling Jaya (MY); Sahami Mohamad Yazid, Selangor (MY); Mohd Asyraf bin Azmi, Rawang (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 388 days.

(21) Appl. No.: 18/302,819

(22) Filed: Apr. 19, 2023

(65) Prior Publication Data

US 2024/0355648 A1      Oct. 24, 2024

(51) Int. Cl.

| | |
|---|---|
| *H01L 21/67* | (2006.01) |
| *H01L 21/3105* | (2006.01) |
| *H01L 21/56* | (2006.01) |
| *H01L 21/677* | (2006.01) |
| *H01L 21/68* | (2006.01) |
| *H10P 72/00* | (2026.01) |
| *H10P 72/30* | (2026.01) |
| *H10P 72/50* | (2026.01) |
| *H10P 95/00* | (2026.01) |
| *H10W 74/01* | (2026.01) |

(52) U.S. Cl.
CPC ...... *H10P 72/0428* (2026.01); *H10P 72/3202* (2026.01); *H10P 72/50* (2026.01); *H10P 95/08* (2026.01); *H10W 74/016* (2026.01)

(58) Field of Classification Search
CPC ............. H01L 21/31058; H01L 21/565; H10P 72/0428; H10P 72/3202; H10P 72/50; H10P 95/08; H10W 74/016
See application file for complete search history.

(56) References Cited

U.S. PATENT DOCUMENTS

| | | | | |
|---|---|---|---|---|
| 4,772,984 A | * | 9/1988 | Machdao | H05K 13/02 |
| | | | | 361/301.1 |
| 4,993,588 A | * | 2/1991 | Willberg | H05K 13/02 |
| | | | | 221/268 |
| 2017/0267464 A1 | * | 9/2017 | Lai | H05K 13/028 |

* cited by examiner

*Primary Examiner* — Peniel M Gumedzoe
(74) *Attorney, Agent, or Firm* — Ronald O. Neerings; Frank D. Cimino

(57) ABSTRACT

A system includes an elongated track having a track surface extending between spaced apart input and output ends of the track, in which the input end is configured to receive packaged semiconductor devices. A contact apparatus is supported above a portion of the track surface, in which the contact apparatus includes a pad having a contact surface extending longitudinally in a direction parallel to and spaced apart from the track surface. An actuator is coupled to the pad and configured to move the contact surface of the pad back and forth in a direction orthogonal to the track surface.

21 Claims, 10 Drawing Sheets

900

902 — FEED SEMICONDUCTOR UNITS ONTO TRACK

904 — MOVE APPARATUS TO RETRACTED POSITION

906 — PROVIDE CONTROL SIGNAL

908 — MOVE APPARATUS TO EXTENDED POSITION TO CONTACT SEMICONDUCTOR UNITS

CONTACT APPARATUS FOR ARRANGING SEMICONDUCTOR DEVICES

TECHNICAL FIELD

This description relates to a contact apparatus for arranging packaged semiconductor devices, such as along an input track.

BACKGROUND

Semiconductor electronic devices can be fabricated in various sizes and package types. Regardless of the type of package or purpose of the device that is produced, the devices are handled and transported quality according to assurance procedures. Due to the mold flash, units fed into the handler input track can have an increased likelihood of jamming along the track. For example, the mold flash can result in units sitting on top of each other (e.g., a piggyback condition) and/or sticking to each other.

SUMMARY

One described example is a system that includes an elongated track having a track surface extending between spaced apart input and output ends of the track. The input end of the track is configured to receive packaged semiconductor devices. A contact apparatus is supported above a portion of the track surface, in which the contact apparatus includes a pad having a contact surface extending longitudinally in a direction parallel to and spaced apart from the track surface. An actuator is coupled to the pad and configured to move the contact surface of the pad back and forth in a direction orthogonal to the track surface.

Another example is a method that includes feeding packaged semiconductor devices in a direction of travel along a track extending between an input end to an output end of the track. Each of the packaged semiconductor devices has a body of a molding material and a pair spaced apart opposing edges and a top surface. The method also includes moving a pad back and forth orthogonally relative to a portion of the track between retracted and extended positions. The pad has a contact surface extending longitudinally in a direction parallel to the direction of travel and, when in the extended position, the contact surface of the pad engages the top surface of a plurality of respective packaged semiconductor devices within the portion of the track.

Yet another example is a method that includes moving a pad of a contact apparatus between extended and retracted positions above a track as packaged semiconductor units travel along the track between input and output ends of the track. The pad is positioned above the track and has a contact surface configured to engage surfaces of an adjacent plurality of the packaged semiconductor units on a portion of the track located opposite the pad when the pad is in the extended position.

DETAILED DESCRIPTION

This description relates to a contact apparatus for arranging packaged semiconductor devices along an input track. The contact apparatus is supported above a track along which the packaged semiconductor devices move, such as part of a backend process (e.g., device testing). The contact apparatus includes a pad at a distal end thereof. The pad has an elongated contact surface extending in a direction parallel to and spaced apart from the track surface. An actuator is coupled to the contact pad and configured to move the pad back and forth in a direction orthogonal to the track surface. The contact surface thus can contact (e.g., tap) a top surface of the semiconductor devices as they move along the track beneath the contact apparatus. The contact between the pad and the semiconductor devices can help space the semiconductor devices end-to-end along the track to reduce piggybacking of adjacent devices. As described herein, the contact apparatus can also separate mold flash from the packaged semiconductor devices. As a result, the likelihood of semiconductor devices jamming along the track can be reduced.

Figure 1A:
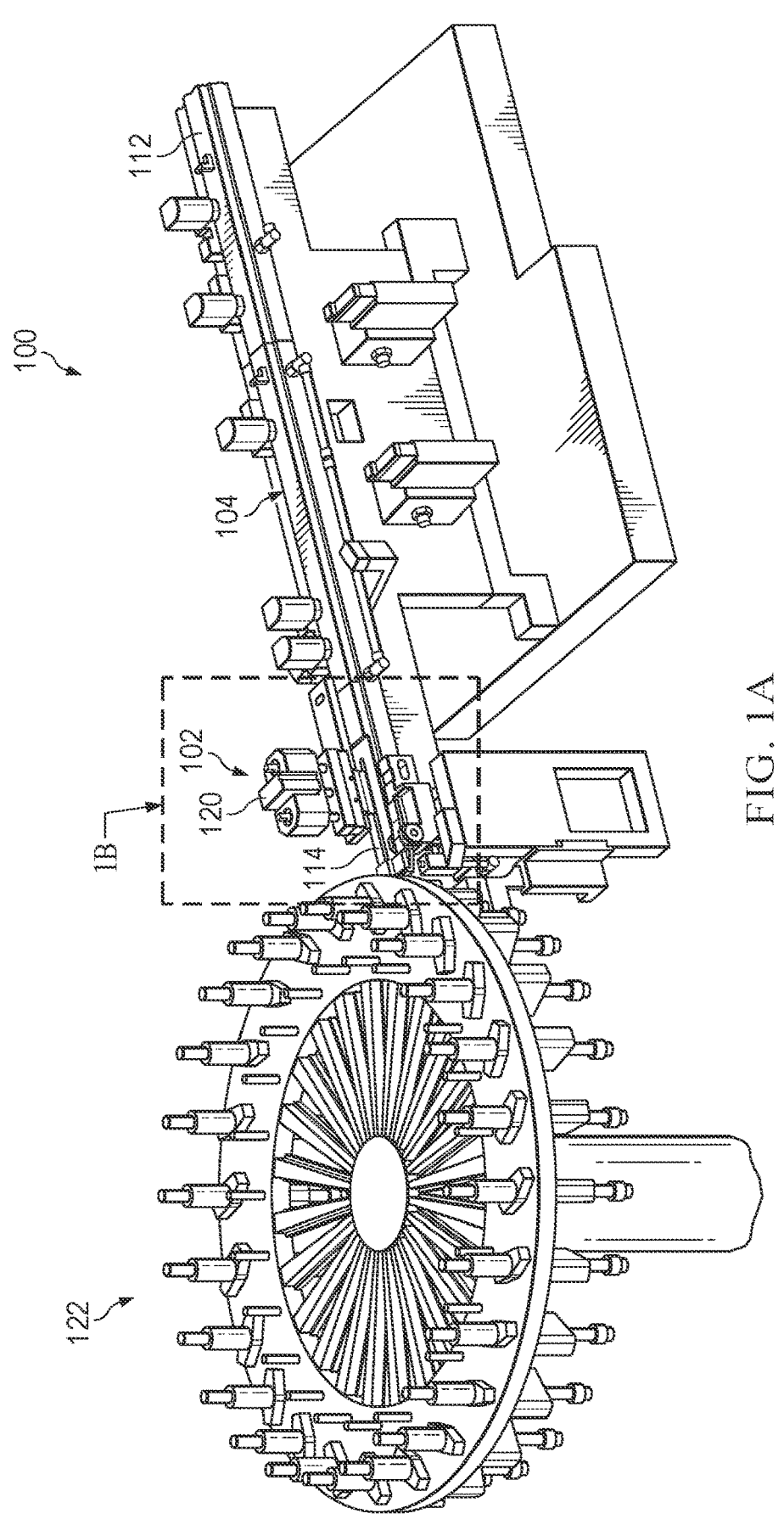
FIGS. 1A and 1B are an isometric view showing a system configured to transfer packaged semiconductor devices, including an example contact apparatus for arranging the packaged devices.
Figure 1B:
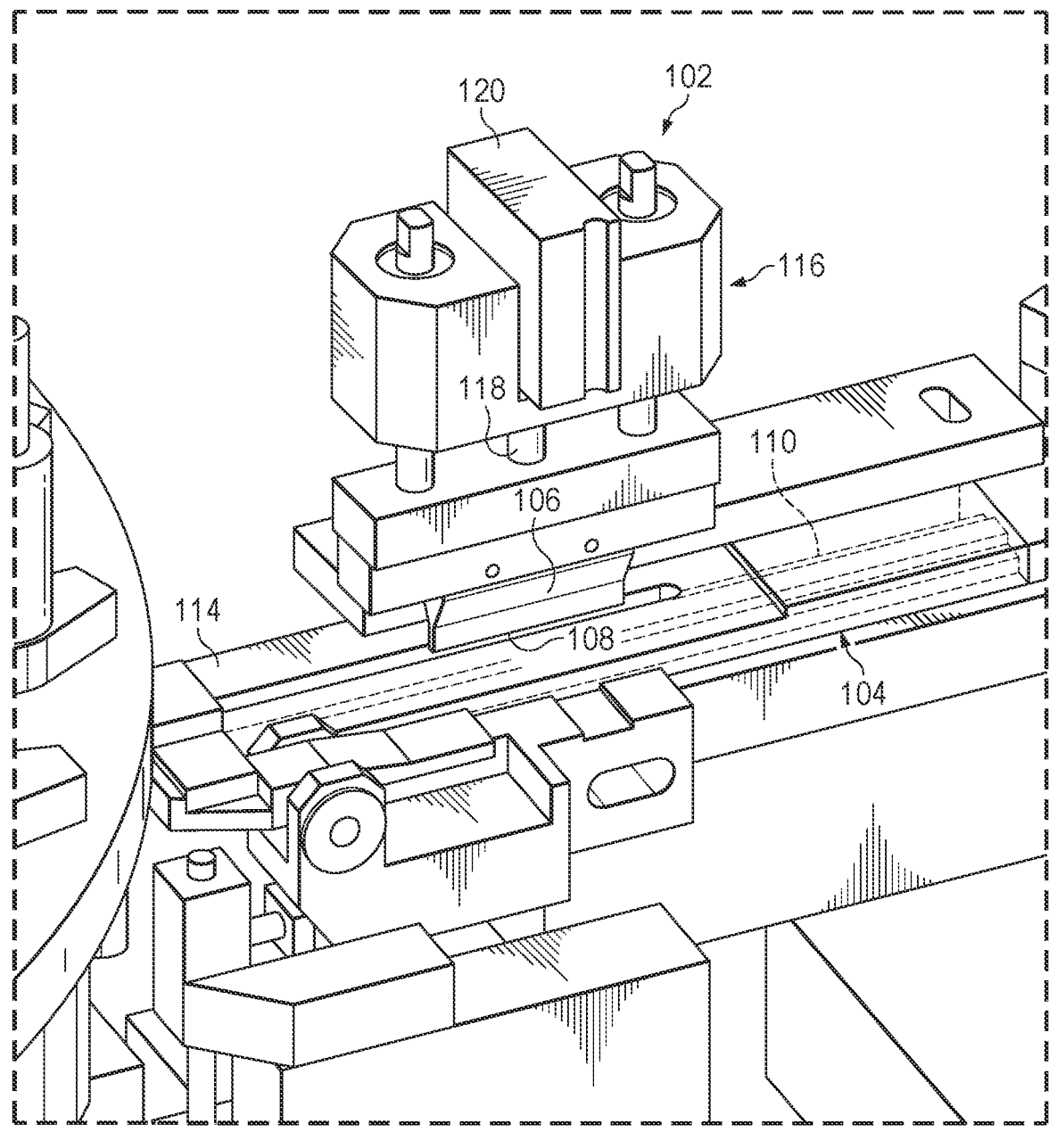

FIGS. 1A and 1B are an isometric view showing part of a transport system 100 configured to transfer packaged semiconductor devices. As described herein, the system 100 includes a contact apparatus 102 supported above a portion of a track 104. The contact apparatus 102 includes a pad 106 extending from a pad support to terminate in a contact surface 108 at a distal end of the pad. The pad 106 extends longitudinally in a direction parallel to and spaced apart from a surface 110 of the track 104. For example, the contact surface at the distal end of the pad 106 has a length that is at least a length of multiple packaged semiconductor devices as transported along the track surface 110. The track surface 110 extends between spaced apart input and output ends 112 and 114, respectively. The track can be linear, curved or include a combination of linear and curved portions between the input and output ends 112 and 114. The input end 112 is configured to receive packaged semiconductor devices, such as from one or more containers (not shown).

A feeder mechanism can be coupled at the input end 112 of the track 104 and be configured to feed packaged semiconductor devices from the container onto the track 104, such as for additional processing according to the capabilities of the system 100. For example, the container is a stick magazine, tray, or tape and reel container that is configured to store and feed the packaged semiconductor devices onto the track 104. The type of container and feed mechanism can vary depending on the type of package structure, the number and arrangement of pins (if any), and the phase of processing to be implemented by the system 100. In an example, the track 104 is configured to transport the packaged semiconductor devices in a linear arrangement (e.g., aligned end-to-end) from the input end 112 to the output end 114 of the track 104. In other examples, the track 104 is configured to accommodate two or more packaged devices in a parallel arrangement for transport along the track surface 110. The track 104 can be moveable and configured to carry the semiconductor devices on the track surface 110 from the input end 112 to the output end 114. The track 104 thus can be provided in various forms configured to move the semiconductor devices along the track (e.g., along a guide mechanism or between side rails) responsive to the feeder providing the semiconductor devices onto the track 104. In an example, an air purge apparatus can be located along the track 104 through which the semiconductor devices are fed.

In the example of FIGS. 1A and 1B, the contact apparatus 102 is supported above the track surface 110 adjacent the output end 114 of the track 104. The contact apparatus 102 includes an actuator 116 coupled to the contact pad 106 by one or more couplings 118. In an example, the coupling 118 is a shaft that extends longitudinally from a proximal body portion of the actuator 116 and has a central longitudinal axis extending therethrough in a direction orthogonal to the track surface 110. The shaft coupling 118 has a distal end coupled to the pad 106. The actuator 116 is configured to move the pad 106 in a direction orthogonal to the track surface 110 by moving the coupling 118 axially in a reciprocating motion. Each stroke of the coupling 118 causes the pad 106 to move a distance back and forth axially between retracted and extended positions. When in the extended position, For example, the contact surface of the pad 106 engages the top surface of a plurality of respective packaged semiconductor devices located on the track between the pad and track surface.

As a further example, the actuator 116 has a central body portion 120 that includes a pneumatic cylinder. The pneumatic cylinder includes a shaft, which provides the coupling 118, and a fluid coupling. The shaft thus extends axially from the cylinder of the central body portion 120. The fluid coupling can be coupled to a source of pressurized fluid through a conduit (not shown). For example, the actuator 116 is configured to control a valve responsive to a control signal (e.g., from a controller) to control the application of pressurized fluid from the fluid source to the fluid coupling of the pneumatic cylinder. The pneumatic cylinder is configured to move the shaft coupling 118 axially between the retracted and extended positions responsive to the receiving and releasing pressurized fluid through the fluid coupling. As used herein, the term fluid can refer to any a substance, including a liquid or gas, that is capable of flowing and that changes its shape at a steady rate when acted upon by a force tending to change its shape. Therefore, while a pneumatic cylinder utilizing air or gas compression is disclosed above and throughout the detailed description, a hydraulic cylinder which uses liquid fluid compression instead of air or gas compression, could be substituted for the pneumatic cylinder along with its associated parts and fittings.

Thus, the contact apparatus 102 is configured to engage packaged devices and adjust the arrangement of devices that might have been disrupted during transport along the track 104 from the input end 112 to the location where the contact apparatus 102 is located. In other examples, the system 100 can include a number of two or more contact apparatuses 102 at spaced apart locations along the length of the track 104. Another transport device (e.g., a pick-and-place (PNP) device) 122 can be located at or near the output end 114 and configured to move each of the semiconductor devices from the output end to a next station, such as semiconductor test apparatus.

Figure 2:
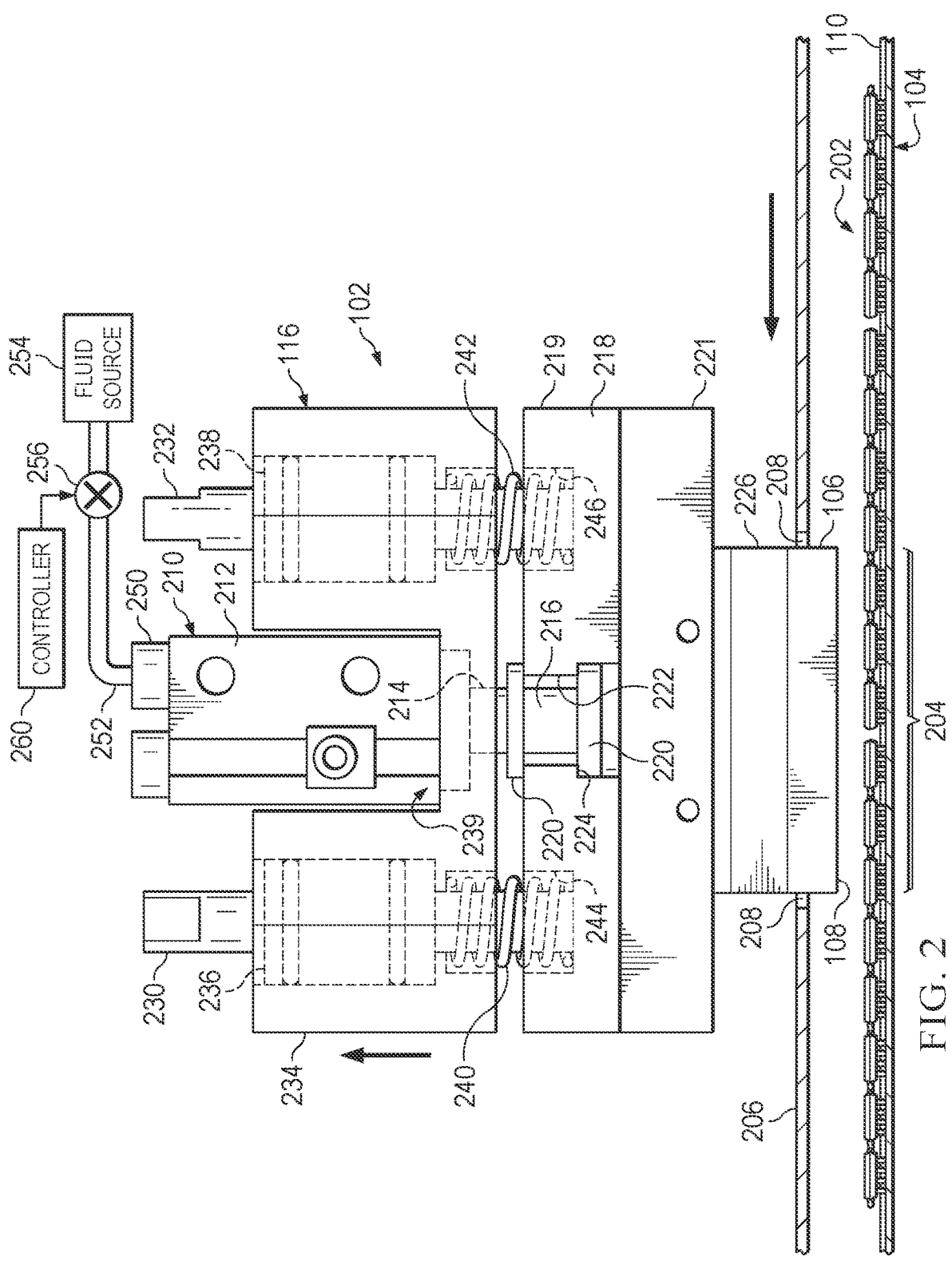
FIG. 2 is a side view of an example contact apparatus configured to arrange packaged semiconductor devices.
Figure 3:
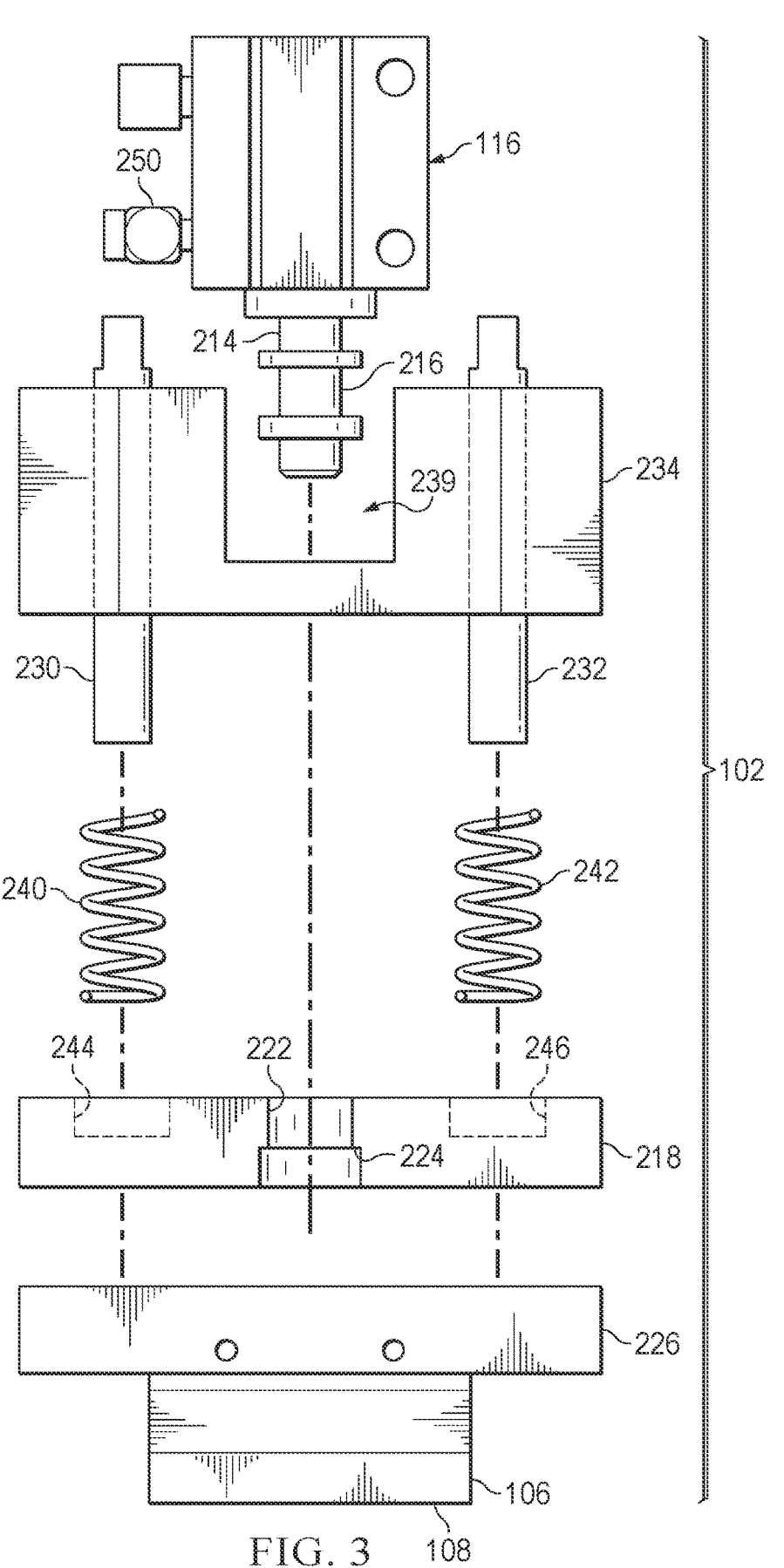
FIG. 3 is an assembly view of an example contact apparatus of FIG. 2.
Figure 4:
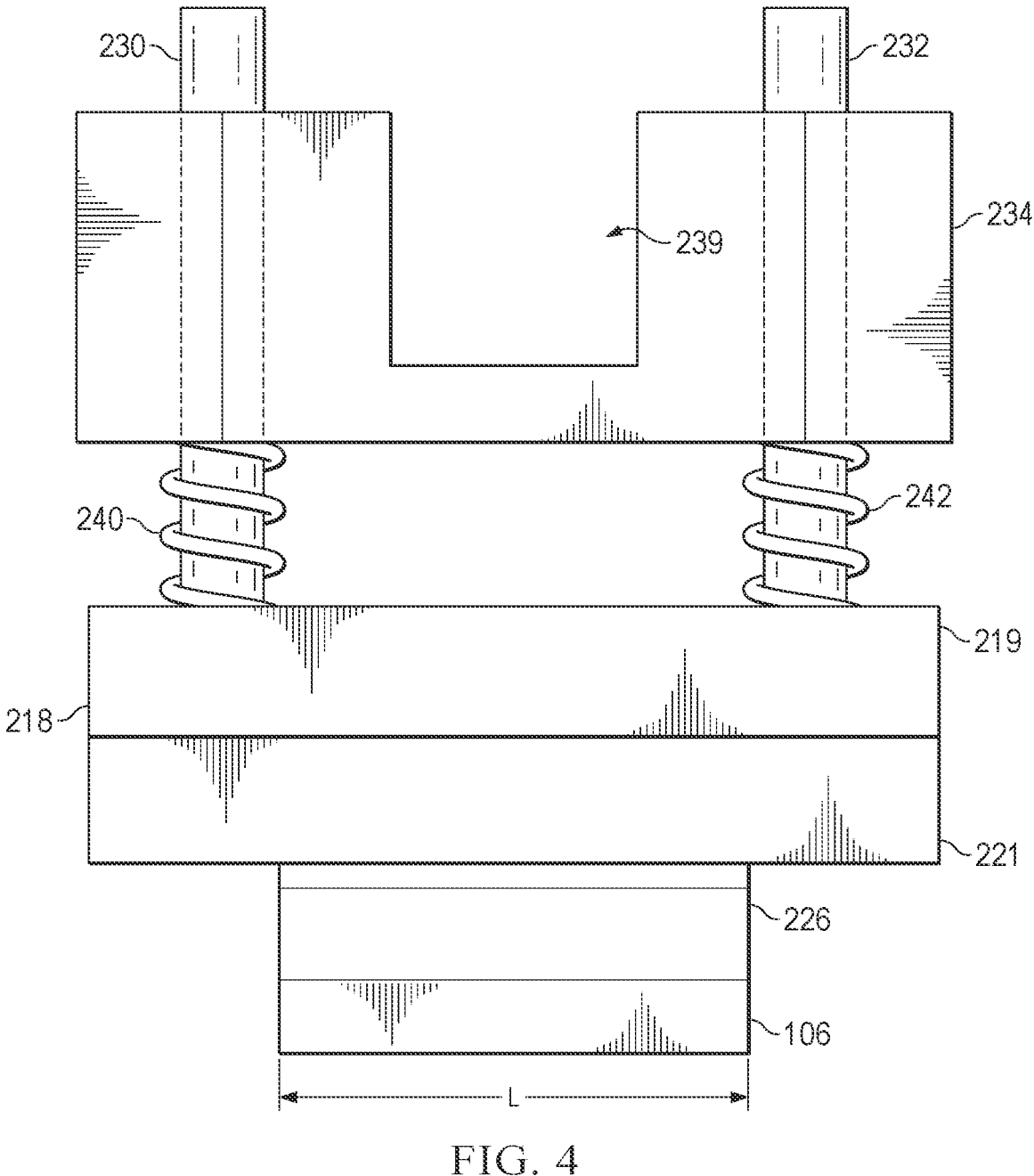
FIGS. 4, 5 and 6 show various views of part of the contact apparatus of FIG. 2 with the actuator removed.
Figure 5:
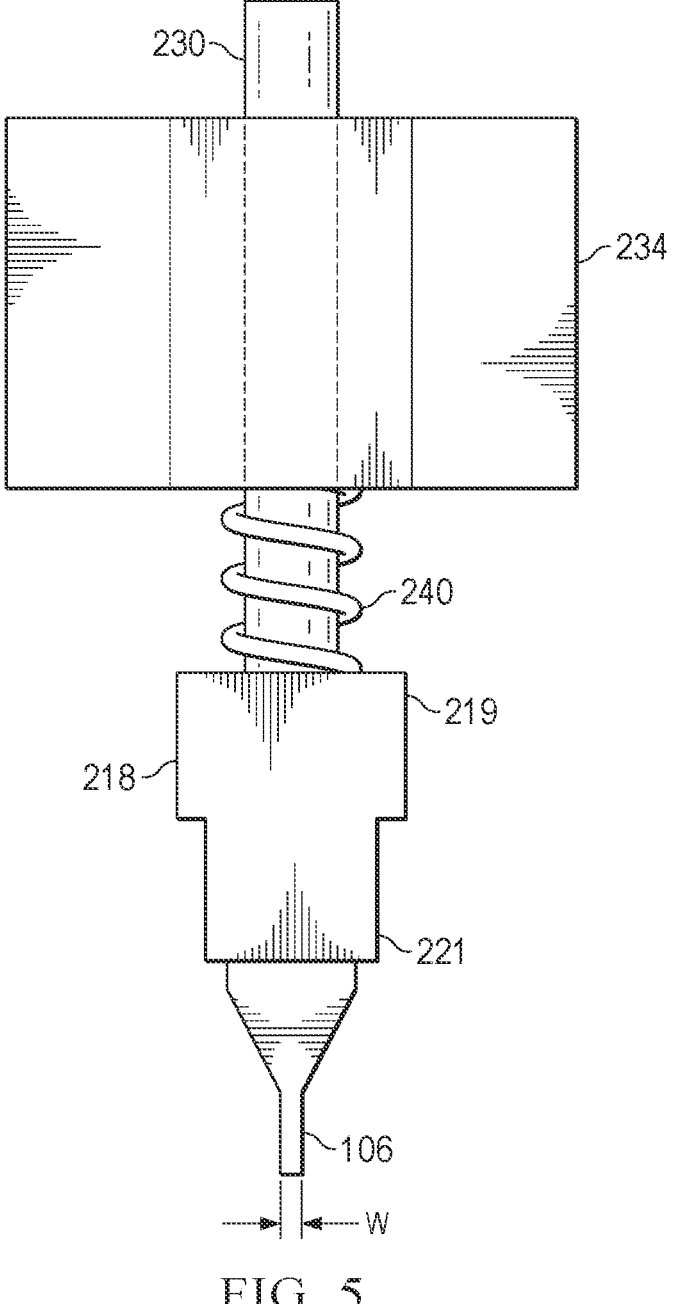
Figure 6:
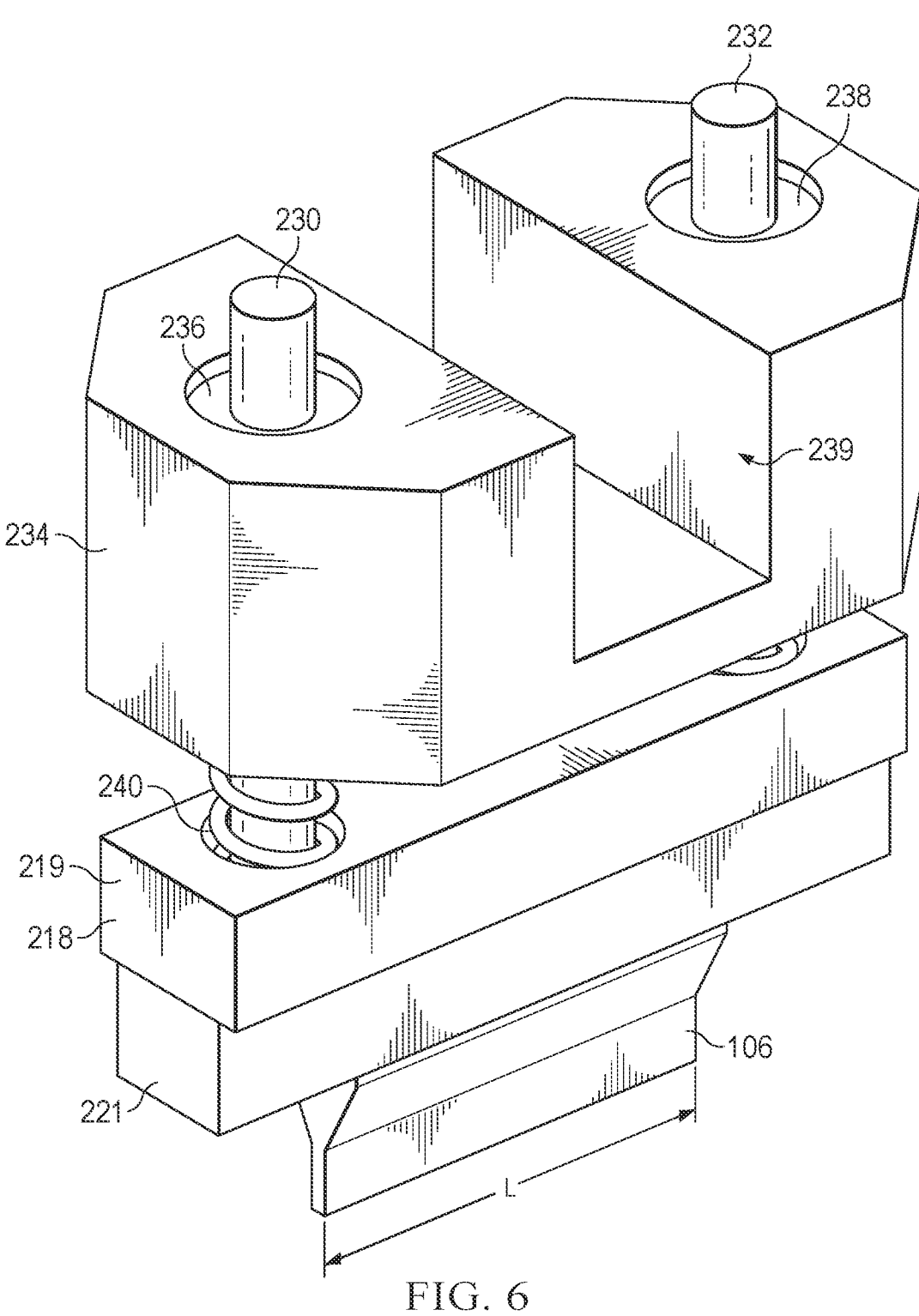

FIG. 2 is a side view of an example contact apparatus 102 positioned relative to a track 104. The contact apparatus 102 is a useful example of the contact apparatus 102 described with respect to FIGS. 1A and 1B. FIGS. 3, 4, 5 and 6 further show various views of the contact apparatus 102 or a portion thereof. FIG. 3 is an exploded view of the contact apparatus 102. FIGS. 4, 5 and 6 show the contact apparatus with the actuator 116 removed, in which FIG. 4 is a front view, FIG. 5 is a side view, and FIG. 6 is an isometric view. Accordingly, the description of FIGS. 2, 3, 4, 5 and 6 refer to FIG. 2.

As described herein, the contact apparatus 102 includes an actuator 116 coupled to a contact pad 106 and is supported above the surface 110 of a track 104. A plurality of semiconductor devices 202 are on the track 104, including a number of semiconductor devices, shown at 204, positioned directly between the track 104 and the contact surface 108 of the pad 106. In the example of FIG. 2, there are six semiconductor devices 204 between the track 104 and the contact surface 108. In other examples, there can be different numbers of semiconductor devices 204 positioned between the track 104 and the contact surface 108, which can depend on an end-to-end length of the semiconductor devices and a length of the contract surface 108 of the pad. The contact surface 108 of the pad 106 (and the pad itself) can be formed of a material having a hardness that is at least as hard as encapsulation layer of the packaged semiconductor devices 202. For example, the encapsulation layer can be an epoxy material, a plastic material or other molding material, which can depend on the type of packaging. The hardness level of the pad 106 thus can help reduce wear of the pad and extend the time between when the pad needs to be replaced.

As described herein, the actuator 116 is configured to move the pad 106 back and forth (e.g., in a reciprocating motion) in a direction orthogonal to the track surface on which the semiconductor devices 204 are positioned. For example, track 104 includes a track cover 206 that extends over at least a substantial portion of the length of the track. The cover can be a solid sheet or part of enclosure configured to protect the devices on the track from dust or other contaminants. An elongated slit 208 extends through the cover 206 proximal the output end of the track, and the pad 106 extends through and is movable within the slit 208 through the cover 206 responsive to movement by the actuator 116.

For example, as shown in FIGS. 4, 5 and 6, a distal end portion of the contact pad 106 has a length, shown as "L" and a width, shown as "W." Each of the length L and the width W is less than the length and width of the slit 208, such that the pad is configured to enable movement of the pad 106 through the slit. Additionally, the length L of the pad 106 and length of the slit 208 can be configured to extend at least a length of multiple packaged semiconductor devices 204 as transported along the track surface 110. In the example of FIG. 2, the length of the pad approximates six semiconductor devices 204, as shown directly beneath the pad surface 108. Other lengths for the pad 106 and slit 208 can be used in other examples.

In the example of FIG. 2, the actuator 116 is shown partially in phantom to depict an example configuration of the actuator. As shown in FIG. 2, the actuator 116 is a pneumatic actuator having a pneumatic cylinder 210. The pneumatic cylinder 210 includes body portion 212 having an interior volume and a shaft (e.g., a piston) 214. The shaft 214 extends axially from the body portion 212 along a direction of movement that is orthogonal to the surface 110 of the track. The body portion 212 thus is configured to support the shaft 214 for axial movement within the interior volume of the body portion. The shaft 214 extends from the cylinder body 212 to terminate in a distal end portion 216 that is coupled to a guide block 218. The guide block 218 can include a proximal portion 219 and a distal portion 221. The distal end portion 216 of the shaft 214 includes a connector configured to couple the shaft to the pad 106, such as through a mating connector part of the guide block 218. The connector of the distal end portion 216 can be a rigid coupling, a clamp, a flange coupling, a pin-type coupling or other fastener configured to mechanically couple the shaft to the contact pad 106.

As an example, the connector of the distal end portion 216 of the shaft 214 includes spaced apart features (e.g., flanges) 220 that extend radially outwardly from an outer surface of the shaft 214. The outwardly extending features 220 of the shaft can be configured to couple the shaft to the guide block 218. For example, the features 220 of the distal end portion 216 are configured to fit within and engage axially spaced apart shoulder surfaces 224 of a central aperture (e.g., a slot) 222 extending through a central part of the guide block 218 (e.g., the proximal guide block portion 219). The distal end portion 216 of the shaft 214 can be fixed to or be an integral part of the shaft 214 (e.g., the distal end portion 216 and shaft 214 can be a monolithic structure). The interior shoulder surface 224 can be at the juncture of a counterbore hole provided within the proximal portion 219 of the guide block 218 that is axially aligned with the central aperture 222, such that the distal end of the shaft is inset into the guide block and spaced from the distal portion 221.

The guide block 218 is coupled to a pad support 226, such as by one or more fasteners (not shown). The pad 106 is coupled to and extends from the pad support 226, such as shown in FIG. 2. The pad 106 can be replaceable with respect to the pad support 226 or the pad support 226 and pad 106 can be replaced as a unit. The guide block 214 is configured to move commensurate with movement of the shaft 214 and, because the pad 106 is coupled to the guide block 218 through the pad support, the pad 106 likewise is configured to move commensurate with movement of the shaft 214 by the actuator 116.

To facilitate axial motion of the pad 106, the actuator 116 can include one or more guide shafts 230 and 232, which extend longitudinally parallel to the shaft 214 through respective laterally spaced apart apertures of a shaft guide block 234. In an example, bushings (e.g., sleeve bearings) 236 and 238 are mounted within the respective apertures of spaced apart side portions of the guide block 234 to enable sliding (or gliding) movement of the shaft guide block 234 along the shafts 230 and 232. As shown in FIGS. 2, 4 and 6, the shaft guide block 234 also includes a slot 239 between the spaced apart side portions of the guide block 234. The slot 239 is configured to receive the body of the pneumatic cylinder 210 therein.

Additionally, the actuator 116 can include one or more springs 240 and 242 configured to mechanically bias the guide block 222 and pad 106 away from a distal end of the shaft guide block 234 and the body 212. For example, the springs 240 and 242 are coil springs having spaced apart proximal and distal ends that are positioned around the respective shafts 230 and 232. The proximal end of each spring 240, 242 can engage a distal surface of the respective busing 236, 238 within the shaft guide block 234 or otherwise be fixed with respect to the shaft guide block and/or in the shaft apertures. The distal end of each spring 240, 242 can engage an interior surface of the distal portion 221 of the guide block through respective apertures 244, 246. For example, the apertures 244 and 246 extend completely through the proximal portion 219 of the guide block 218, and are configured to hold distal portions of the springs 240 and 242 and respective shafts 230 and 232. Thus, the proximal portion 219 of the guide block 218 can be referred to as a spring guide block. Alternatively, the apertures can extend from the proximal surface of the spring guide block 218 to an intermediate location within the guide block 218 between the proximal and distal surfaces of the guide block.

In an example where the actuator 116 includes the one-way pneumatic cylinder 210, the pneumatic cylinder includes one or more fluid couplings 250. The fluid coupling can be coupled to fluid source 254 through a length of one or more conduits 252. The fluid source 254 can be a source of positively or negatively pressurized fluid, such as compressed air or a vacuum, respectively. A control valve 256 can be coupled between the fluid coupling 250 and the fluid source 254 (e.g., by respective lengths of conduit 252) to control the flow of pressurized fluid between the cylinder and the fluid source 254. The fluid source 254 is thus fluidly connected to the pneumatic cylinder 210 through the valve 256.

In the example of FIG. 2, the control valve 256 is an electrically-actuated and normally-open solenoid valve, and the fluid source 254 is a vacuum (e.g., having a pressure that is less than the pressure within the solenoid). The valve 256 is configured to open and close responsive to a control signal from a controller 260. The controller 260 can be implemented as executable instructions (e.g., software) programmed to control operation of the track and its associated handling functions for feeding the devices to next stage of the process. The controller 260 can be configured to provide the control signal to control the actuator to contact the semiconductor devices 202 beneath the pad 106 periodically. The controller 260, for example, can be programmed to control the rate of actuation (e.g., by the control signal) depending on the length of the pad 106, the speed of the track 104, the compression force of the springs 240 and 242 and/or the size of the semiconductor devices.

As an example, the valve 256 is normally open, which results in a vacuum being applied to the pneumatic cylinder 210 from the fluid source. The pneumatic cylinder 210 is configured to retract the shaft 214 axially into the cylinder responsive to the applied vacuum, which results in the pad 106 also moving to the retracted position. The vacuum has sufficient force to compress the springs 240 and 242 between the shaft guide block 234 and the pad support 226. The controller 260 provides the control signal to the valve 256, and the valve closes to cut off the supply of fluid (e.g., air) from the cylinder 210.

As a result of the vacuum terminating, the cylinder 210 is configured to release the shaft 214, and the compression force of the springs 240 and 242 is configured to extend the shaft and move the pad 106 to its extended position. In the extended position, the contact surface 108 of the pad 106 engages the semiconductor devices on the track beneath the pad. The springs 240 and 242 are configured to provide sufficient force to enable the pad to push down against piggybacked semiconductor devices and arrange the devices on the track end to end without piggybacking. For example, the displacement force of the springs 240 and 242 can be less than approximately 15 N (e.g., between about 5 N to about 10 N). Additionally, the distance of travel for the shaft (e.g., stroke) can be constrained (e.g., a stroke limit of about 4 mm or another distance) to help control the impact force by the pad 106 on the devices 202. The contact between the pad 106 and the semiconductor devices 202 can also break off mold flash from ends of the semiconductor devices 202. The controller can terminate the control signal (or provide a deactivation signal) to the valve 256 to fluidly couple the fluid source and the cylinder 210 to retract the shaft 214 and pad 106 accordingly. The process can repeat over time to move the pad 106 back and forth orthogonally between retracted and extended positions.

Figures 7A, 7B:
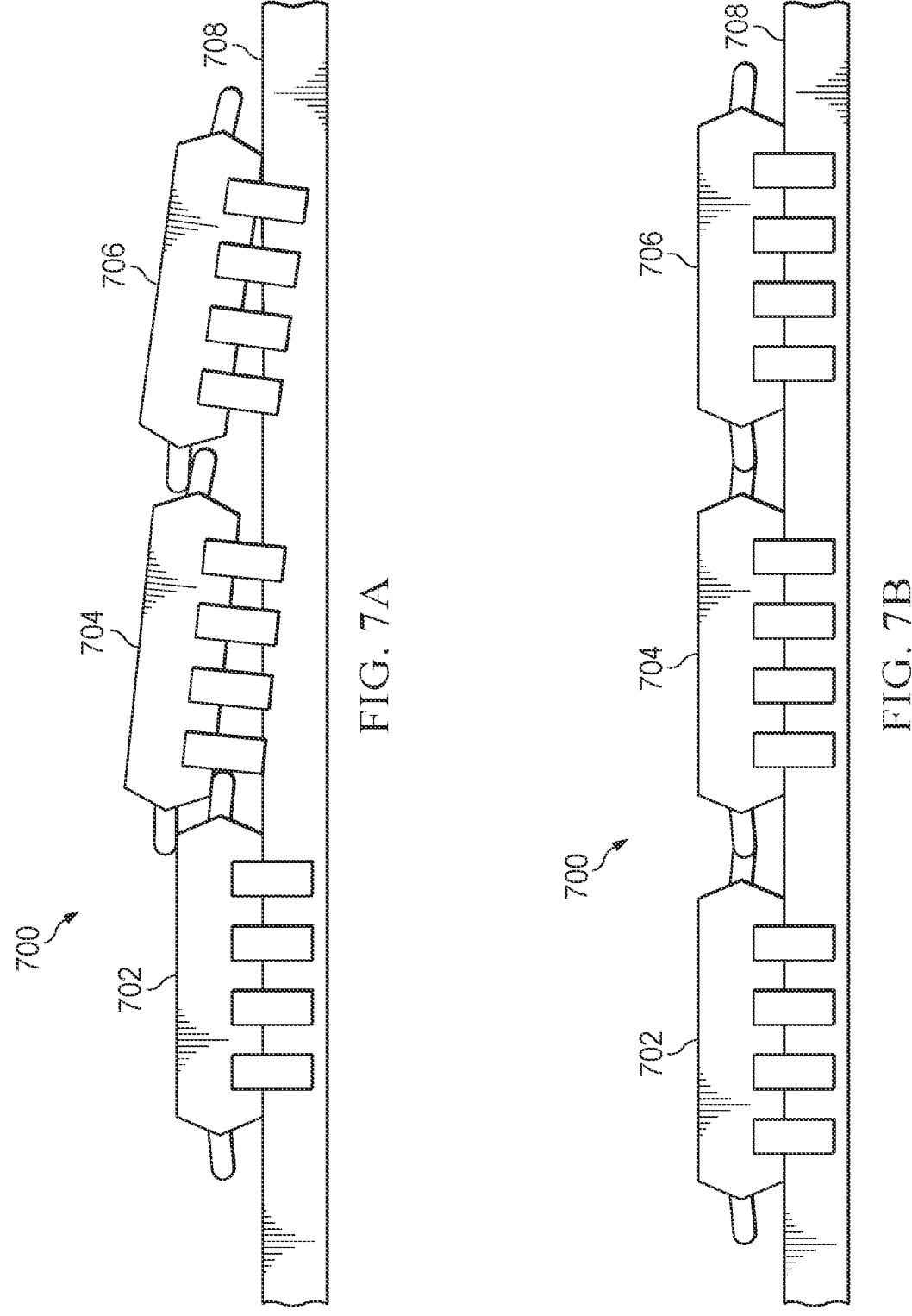
FIGS. 7A and 7B show different arrangements of semiconductor devices along a length of a track.

FIGS. 7A and 7B show part of a handler input track 700, in which semiconductor devices 702, 704 and 706 are being moved along a track 708 and at least some of the devices are arranged in conditions that have an increased likelihood of jamming along the track. In the example of FIG. 7A, the semiconductor devices 702, 704 and 706 are shown in a piggyback condition. In the example of FIG. 7B, the semiconductor devices 702, 704 and 706 are shown stuck together at respective ends. In the absence of using a contact apparatus 102 to rearrange the devices on the track 708, when units stick together or piggyback, there can be an associated loss of units and/or downtime of the handling system. Downtime due to jamming can result in a significant expense, particularly in systems that include several handling systems.

In a piggyback condition, an end of one or more semiconductor devices is at least partially on or vertically offset (e.g., offset in a direction orthogonal to the track surface) from an end of an adjacent semiconductor device. For example, each of the devices 702, 704 and 706 includes mold flash extending outwardly from its respective ends due to prior encapsulation in packaging material. As shown in FIG. 7A, mold flash at an end of the device 704 is piggybacking on an adjacent end (e.g., mold flash) of the device 702, and mold flash at an end of the device 706 is piggybacking on an adjacent end (e.g., mold flash) of the device 704. The piggybacking between adjacent semiconductor devices can cause the handling system to jam.

In the example of FIG. 7B, mold flash extending outwardly from the respective ends of the semiconductor devices 702, 704 and 706 mechanically connects adjacent ends to each other (e.g., semiconductor devices stick to each other) along the track 708. For example, the units can stick to each other during singulation (e.g., at the output end 114 of the track), which can cause units to drop or jam. In some examples, the mold material between adjacent, piggybacking devices 702, 704 and 706, such as shown in FIG. 7A, also can cause the adjacent devices to stick together.

Figure 8A:
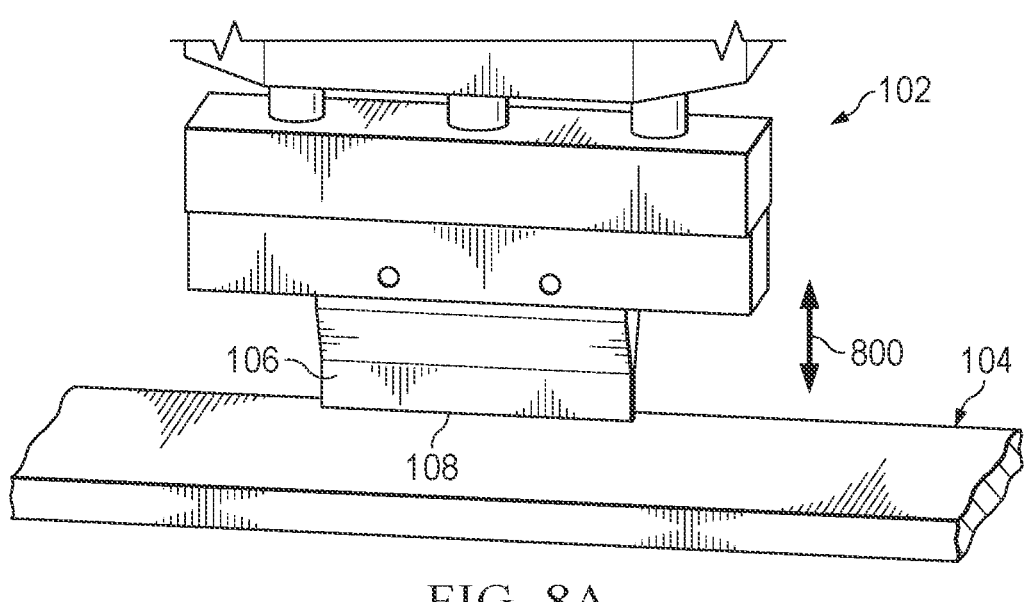
FIGS. 8A and 8B are side views showing an example contact apparatus being used to arrange packaged semiconductor devices on a track.
Figure 8B:
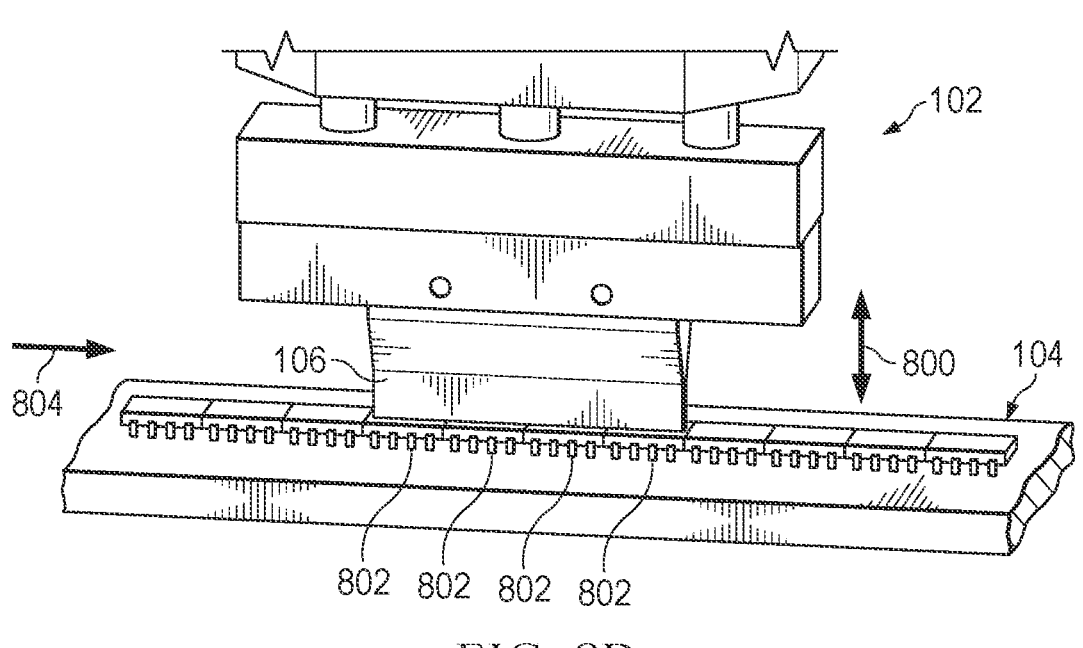

FIGS. 8A and 8B show a front view of an example contact apparatus 102 moving between retracted and extended positions to arrange packaged semiconductor devices on a track 104, which can reduce piggybacking and separate adjacent semiconductor devices. FIGS. 8A, and 8B provide a useful example of how the contact apparatus 102 of FIGS. 1-6 can be used to arrange semiconductor devices along the track 104. Accordingly, the description of FIGS. 8A and 8B also refer to FIGS. 1-6.

In FIG. 8A, the contact pad 106 is shown in a retracted position, in which the contact surface 108 of the pad is spaced apart from the track. For example, the actuator 106 is configured to move the pad back and forth in a direction, shown at 800, which is orthogonal to a surface of the track 104. In FIG. 8A, no semiconductor devices are shown on the track between the pad and the track. FIG. 8B shows the pad 106 in the extended position positon as semiconductor devices 802 are fed along the track in a direction shown at 804. Thus, in FIG. 8B, the contact surface 108 of the pad 106 engages the top surface of the semiconductor devices 802 to arrange the devices along the track 104. The arranging (or rearranging) implemented by the pad can include separating adjacent devices that might be stuck together (see, e.g., FIG. 7B) and/or repositioning semiconductor devices from a piggyback condition (see, e.g., FIG. 7A) to an end-to-end and separated condition along the track 104.

Figure 9:
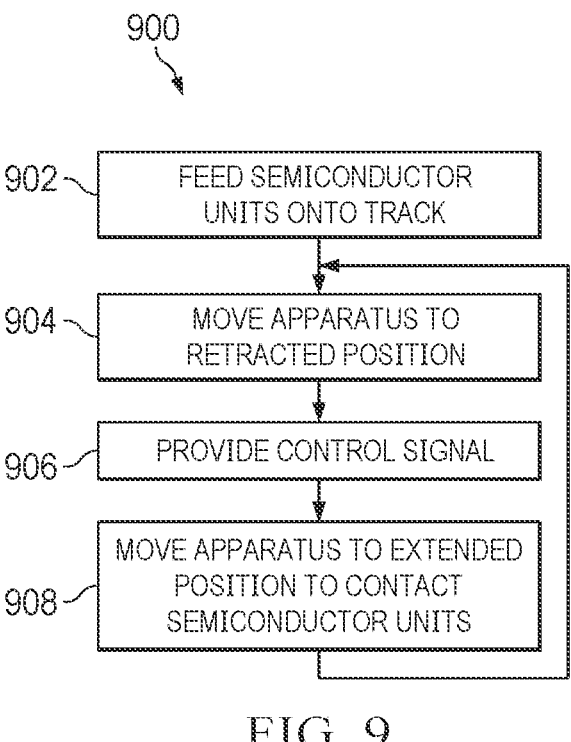
FIG. 9 is a flow diagram of an example method for arranging packaged semiconductor devices.

FIG. 9 is a flow diagram of an example method 900 for arranging packaged semiconductor devices. The method 900 can be implemented using the contact apparatus 102 described herein, such as shown in FIGS. 1-6, 8A and 8B. Accordingly, the description of the method 900 also refers to FIGS. 1-6, 8A and 8B.

The method 900 can begin at 902 in which semiconductor units are fed onto a track of a handler system. For example, the semiconductor units are packaged semiconductor devices 202, 702, 704, 706 or 802, such as ICs or SOCs, which are fed from a magazine or other type of container onto the track 104. In some examples, the contact apparatus 102 can be located proximal the output end 114 of the track 104, such as shown in FIG. 1A.

At 904, the contact apparatus can start in or be moved to a retracted position. For example, the contact apparatus 102 includes an actuator 116 configured to move a contact pad 106 thereof between retracted and extended positions relative to the track 104. At 906, a control signal is provided. For example, a controller 260 is configured to provide a control signal to command the actuator 116 to move the contact pad 106 to one of the retracted or extended positions. In some examples, the actuator 116 includes a pneumatic cylinder coupled to a fluid source through a valve (e.g., a solenoid valve), which can be normally open or normally closed. The valve thus can close or open responsive to the control signal.

At 908, the contact apparatus can be moved to the extended position to contact semiconductor units. For example, the actuator 116 is configured to move the contact pad 106 in a direction orthogonal to the surface of the track responsive to the control signal (provided at 906). The actuator 116 can move a sufficient distance and with sufficient force to arrange the packaged semiconductor devices on the track. As described herein, the contact between the pad 106 and the semiconductor devices can separate adjacent devices that might be stuck together and/or reposition semiconductor devices from a piggyback condition to end-to-end and separated condition along the track 104. From 908, the method 900 can return to 902 and repeat the actions at 902 through 908 for arranging the semiconductor devices as the devices are fed onto the track.

In an example, the contact surface 108 of the pad 106 has a length that is at least two times the length between the opposing edges of a given one of packaged semiconductor devices. Thus, moving the pad to the extended position (at 908) causes the contact surface 108 to concurrently engage at least two (e.g., at least four, six or more) of the packaged semiconductor devices. As described herein, in addition to arranging the packaged semiconductor devices along the track, the engagement between the contact surface of the pad and the packaged semiconductor devices can also dislodge mold flash from one or more of the opposing edges of the packaged semiconductor devices. The method 900 thus can help improve throughput as well as reduce the additional costs associated with jamming and/or lost semiconductor devices, which can occur in the absence of implementing the method.

As a further example, such as shown in FIG. 2, the actuator 116 can include pneumatic cylinder 210 and a moveable shaft that extends axially from the cylinder. A distal end of the draft can be coupled to the pad. In such an example, the moving at 908 can include actuating the pneumatic cylinder to force the shaft axially to move the pad to the extended retracted position responsive to the control signal. Similarly, at 904, the pneumatic cylinder can be actuated to move the pad to the retracted position, such as responsive to the control signal (or the absence of a control signal).

The movement of the pad to the extended position can be implemented by the pneumatic cylinder or by an arrangement of one or more springs (e.g., coupled between the pad and shaft support), such as described herein with respect to FIGS. 2-6. For example, the movement at 904 and 908 can be implemented by controlling the pneumatic cylinder to enable the spring to force the pad to the respective positions.

In this description, numerical designations "first", "second", etc. are not necessarily consistent with same designations in the claims herein. Additionally, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. A method comprising:

feeding packaged semiconductor devices in a direction of travel along a track extending between an input end to an output end of the track, in which each of the packaged semiconductor devices has a body of a molding material and a pair spaced apart opposing edges and a top surface; and moving a pad back and forth orthogonally relative to a portion of the track between retracted and extended positions, in which the pad has a contact surface extending longitudinally in a direction parallel to the direction of travel and, when in the extended position, the contact surface engages the top surface of a plurality of respective packaged semiconductor devices within the portion of the track; and wherein the contact surface of the pad has a length in the direction of travel that is at least two times a length between opposing edges of a given one of packaged semiconductor devices, and moving the pad to the extended position causes the contact surface to concurrently engage at least two of the packaged semiconductor devices.

2. The method of claim 1, wherein moving the pad to the extended position causes the contact surface to concurrently engage at least four of the packaged semiconductor devices within the portion of the track.

3. The method of claim 1, wherein the portion of the track is located proximal the output end of the track, in which each of the packaged semiconductor devices is picked up from the output end.

4. A method comprising:

feeding packaged semiconductor devices in a direction of travel along a track extending between an input end to an output end of the track, in which each of the packaged semiconductor devices has a body of a molding material and a pair spaced apart opposing edges and a top surface;

moving a pad back and forth orthogonally relative to a portion of the track between retracted and extended positions, in which the pad has a contact surface extending longitudinally in a direction parallel to the direction of travel and, when in the extended position, the contact surface engages the top surface of a plurality of respective packaged semiconductor devices within the portion of the track; and wherein the engagement between the contact surface of the pad and the packaged semiconductor devices dislodges mold flash from at least one edge of the packaged semiconductor devices and/or arranges the packaged semiconductor devices end-to-end within the portion of the track.

5. The method of claim 4, wherein the contact surface of the pad has a length in the direction of travel that is at least two times a length between opposing edges of a given one of packaged semiconductor devices, and moving the pad to the extended position causes the contact surface to concurrently engage at least two of the packaged semiconductor devices.

6. The method of claim 5, wherein moving the pad to the extended position causes the contact surface to concurrently engage at least four of the packaged semiconductor devices within the portion of the track.

7. A method comprising:

feeding packaged semiconductor devices in a direction of travel along a track extending between an input end to an output end of the track, in which each of the packaged semiconductor devices has a body of a molding material and a pair spaced apart opposing edges and a top surface;

moving a pad back and forth orthogonally relative to a portion of the track between retracted and extended positions, in which the pad has a contact surface extending longitudinally in a direction parallel to the direction of travel and, when in the extended position, the contact surface engages the top surface of a plurality of respective packaged semiconductor devices within the portion of the track; and wherein the pad is coupled to a shaft extending axially from a pneumatic cylinder, and moving the pad includes:

actuating the pneumatic cylinder to force the shaft axially to move the pad to one of the retracted or extended positions responsive to a control signal.

8. The method of claim 7, wherein at least one spring is coupled between the pad and a shaft support at a distal end of the pneumatic cylinder, and moving the pad further includes:

releasing the pneumatic cylinder to enable the at least one spring to force the pad to the other of the retracted or extended positions.

9. The method of claim 7, wherein a valve is coupled between the pneumatic cylinder a source of pressurized fluid and the valve is controlled to provide for flow of fluid into or out of the pneumatic cylinder responsive to the control signal.

10. The method of claim 7, wherein the contact surface of the pad has a length in the direction of travel that is at least two times a length between opposing edges of a given one of packaged semiconductor devices, and moving the pad to the extended position causes the contact surface to concurrently engage at least two of the packaged semiconductor devices.

11. The method of claim 10, wherein moving the pad to the extended position causes the contact surface to concurrently engage at least four of the packaged semiconductor devices within the portion of the track.

12. A method comprising:

feeding packaged semiconductor devices in a direction of travel along a track extending between an input end to an output end of the track, in which each of the packaged semiconductor devices has a body of a molding material and a pair spaced apart opposing edges and a top surface;

moving a pad back and forth orthogonally relative to a portion of the track between retracted and extended positions, in which the pad has a contact surface extending longitudinally in a direction parallel to the direction of travel and, when in the extended position, the contact surface engages the top surface of a plurality of respective packaged semiconductor devices within the portion of the track; and wherein moving the pad includes moving at least a distal end portion of the pad through a slit in a cover that is spaced apart from and extends over the track.

13. The method of claim 12, wherein the contact surface of the pad has a length in the direction of travel that is at least two times a length between opposing edges of a given one of packaged semiconductor devices, and moving the pad to the extended position causes the contact surface to concurrently engage at least two of the packaged semiconductor devices.

14. The method of claim 13, wherein moving the pad to the extended position causes the contact surface to concurrently engage at least four of the packaged semiconductor devices within the portion of the track.

15. A method comprising:

moving a pad of a contact apparatus between extended and retracted positions above a track as packaged semiconductor units travel along the track between input and output ends of the track, in which the pad is positioned above the track and has a contact surface configured to engage surfaces of an adjacent plurality of the packaged semiconductor units on a portion of the track located opposite the pad when the pad is in the extended position; and wherein engagement between the contact surface of the pad and the packaged semiconductor units dislodges mold flash from the packaged semiconductor devices and/or arranges the packaged semiconductor devices end-to-end within the portion of the track.

16. A method comprising:

moving a pad of a contact apparatus between extended and retracted positions above a track as packaged semiconductor units travel along the track between input and output ends of the track, in which the pad is positioned above the track and has a contact surface configured to engage surfaces of an adjacent plurality of the packaged semiconductor units on a portion of the track located opposite the pad when the pad is in the extended position; and wherein the contact surface of the pad has a length extending in a longitudinal direction of the track that is at least a length of two adjacent packaged semiconductor devices and the moving the pad to the extended position causes the contact surface to concurrently engage at least two adjacent packaged semiconductor devices.

17. A method comprising:

moving a pad of a contact apparatus between extended and retracted positions above a track as packaged semiconductor units travel along the track between input and output ends of the track, in which the pad is positioned above the track and has a contact surface configured to engage surfaces of an adjacent plurality of the packaged semiconductor units on a portion of the track located opposite the pad when the pad is in the extended position, wherein the contact surface of the pad has a length in the direction of travel that is at least two times a length between opposing edges of a given one of packaged semiconductor devices, and moving the pad to the extended position causes the contact surface to concurrently engage at least two of the packaged semiconductor devices.

18. The method of claim 17, wherein moving the pad to the extended position causes the contact surface to concurrently engage at least four of the packaged semiconductor devices within the portion of the track.

19. The method of claim 17, wherein the portion of the track is located proximal the output end of the track, in which each of the packaged semiconductor devices is picked up from the output end.

20. A method comprising:

moving a pad of a contact apparatus between extended and retracted positions above a track as packaged semiconductor units travel along the track between input and output ends of the track, in which the pad is positioned above the track and has a contact surface configured to engage surfaces of an adjacent plurality of the packaged semiconductor units on a portion of the track located opposite the pad when the pad is in the extended position, wherein moving the pad includes moving at least a distal end portion of the pad through a slit in a cover that is spaced apart from and extends over the track.

21. The method of claim 20, wherein the contact surface of the pad has a length extending in a longitudinal direction of the track that is at least a length of two adjacent packaged semiconductor devices and the moving the pad to the extended position causes the contact surface to concurrently engage at least two adjacent packaged semiconductor devices.

* * * * *